(12) United States Patent
Sessink

(10) Patent No.: US 6,408,168 B1
(45) Date of Patent: Jun. 18, 2002

(54) RECEIVER WITH AUTOMATIC GAIN CONTROL CIRCUIT

(75) Inventor: Josephus A. M. Franciscus Sessink, Nuenen (NL)

(73) Assignee: Mannesmann VDO AG (DE)

( * ) Notice: Subject to any disclaimer, the term of this patent is extended or adjusted under 35 U.S.C. 154(b) by 39 days.

(21) Appl. No.: 09/607,373

(22) Filed: Jun. 30, 2000

(30) Foreign Application Priority Data

Jun. 30, 1999 (EP) ......................................... 99 202 113.9

(51) Int. Cl.[7] ................................................. H04B 1/06
(52) U.S. Cl. ................................ 455/250.1; 455/232.1; 455/234.1; 455/234.2
(58) Field of Search ........................... 455/232.1, 234.1, 455/234.2, 245.2, 250.1, 254, 295, 130, 136, 550, 266, 183.2, 182.2, 180.3, 174.1, 173.1, 78

(56) References Cited

U.S. PATENT DOCUMENTS

| 4,355,414 | A | * | 10/1982 | Inoue et al. | ............. | 455/184.1 |
| 4,654,884 | A | * | 3/1987 | Sakai et al. | ............. | 455/183.2 |
| 5,222,255 | A | * | 6/1993 | Kuo et al. | ................. | 455/266 |
| 5,239,701 | A | * | 8/1993 | Ishii et al. | ............... | 455/180.1 |
| 5,483,694 | A | * | 1/1996 | Bartels et al. | ............. | 455/295 |

FOREIGN PATENT DOCUMENTS

| GB | 2223146 | 3/1990 | ............. H04B/1/10 |
| JP | 7143025 | 6/1995 | ............. H04B/1/707 |
| WO | 9930426 | 6/1999 | ............. H04B/1/10 |

\* cited by examiner

Primary Examiner—Vivian Chang
Assistant Examiner—John J Lee
(74) Attorney, Agent, or Firm—Robert J. Depke; Mayer, Brown & Platt

(57) ABSTRACT

A receiver comprising analog signal processing means, intermodulation interference detection means and an automatic gain control circuit for controlling the gain of said analog signal processing means, in which an output of the analog signal processing means is coupled through frequency selective means for channel selection and an amplitude detector to a first terminal of the intermodulation interference detection means. A signal generator is used to generate a gain modulation signal being coupled to a gain control input of said analog signal processing means as well as to a second terminal of the intermodulation interference detection means. The intermodulation interference detection means comprise a correlator being included in a feed back loop of said automatic gain control circuit supplying a DC gain control signal to the gain control input of the analog signal processing means at a detection of differences in relative variations between the gain modulation signal on the one hand and the output signal of the amplitude detector on the other hand for reducing said differences by a DC gain setting adjustment of the analog signal processing means.

6 Claims, 3 Drawing Sheets

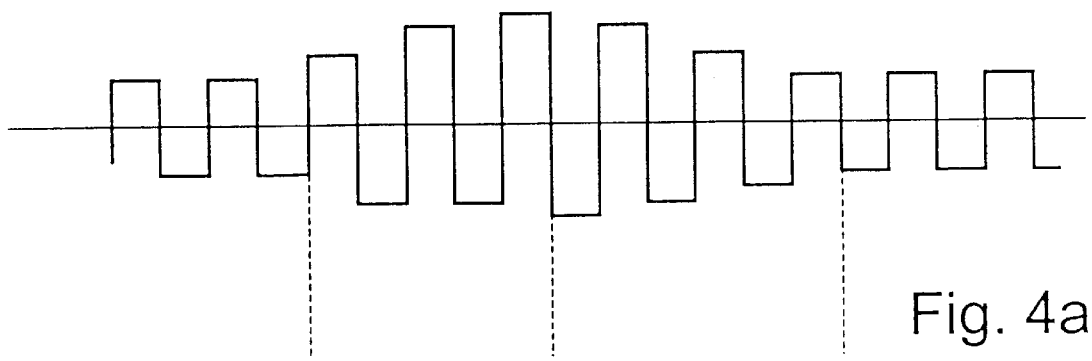
Fig. 4a
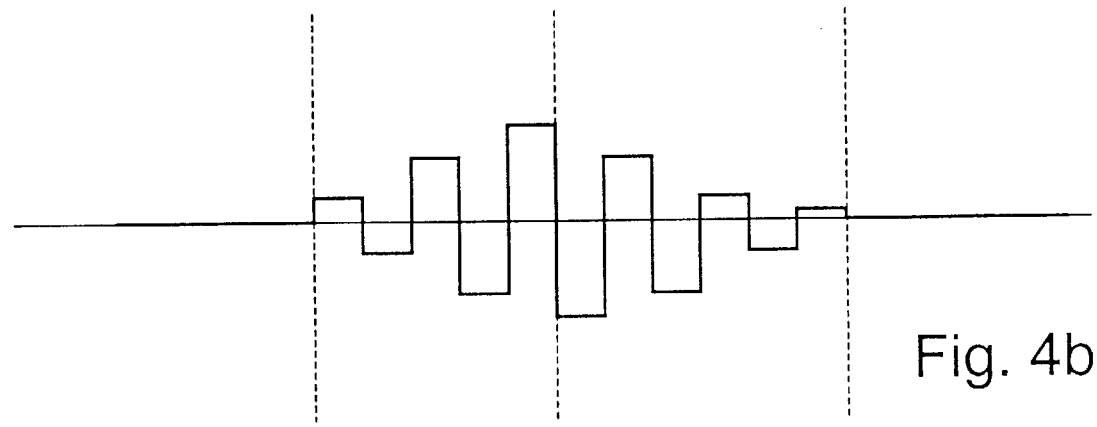
Fig. 4b
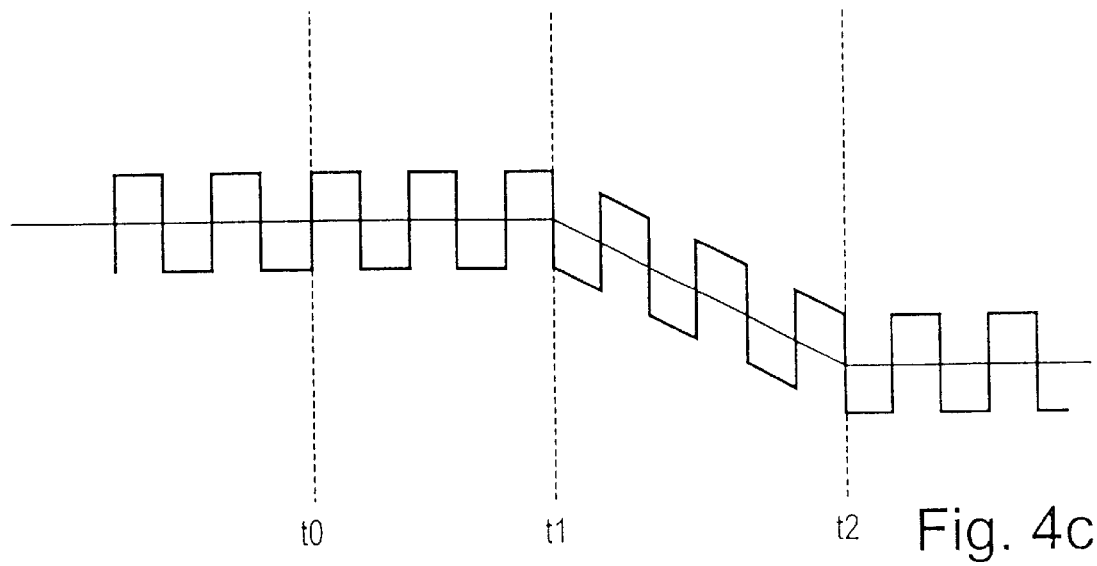
t0　　　t1　　　t2　Fig. 4c

RECEIVER WITH AUTOMATIC GAIN CONTROL CIRCUIT

BACKGROUND OF THE INVENTION

1. Field of the Invention

The present invention relates generally to the field of telecommunications. More specifically, the present invention is directed to a receiver comprising analog signal processing means, intermodulation interference detection means and an automatic gain control circuit (AGC) for controlling the gain of said analog signal processing means, and the gain of said RF analog signal processing means.

2. Description of the Related Art

A conventional design for such a receiver is known from U.S. Pat. No. 4,654,884. The radio receiver disclosed therein, comprises an automatic gain control circuit in which intermodulation interference is detected by comparing the signal level within the bandwidth of a desired radio channel with that of interfering radio-channels deviating from the desired radio-channel by a frequency distance allowing intermodulation interferences to occur within the desired radio-channel. An intermodulation interference indication signal is generated when the signal level of the desired radiochannel becomes smaller than the signal level of one of the interfering channels. The intermodulation interference indication signal is used to control the gain of the RF analog signal processing means.

The automatic gain control obtained therewith requires accurate matching between the specific characteristic of the intermodulation interference indication signal being generated on the one hand and the deterioration of the useful signal caused by the initiating intermodulation interference on the other hand. Due to element tolerance deviations a safety margin has to be taken into account in defining the specific characteristic of the intermodulation interference indication signal to prevent either over-or underdosing the gain control, respectively resulting in loss of useful signal components or insufficient suppression of intermodulation interference. This safety margin thus limits the accuracy in gain control.

Furthermore, to measure the signal level of an interfering channel, the receiver has to interrupt its correct tuning position, in which a desired radio-signal is received, and switch over its tuning to the interfering channel. To eliminate the switching of the tuning and the reception of interfering signals during level detection, the receiver has to be muted. To come to a reliable level detection, the period during which the receiver has to stay tuned to said interfering channel has to exceed a certain level detection time constant, thereby defining a minimum duration for the mute period. Furthermore, especially when the receiver is used in a fast changing environment, e.g. when being mounted on a moving object such as an automobile, the interference channel level check has to be carried out rather frequently, thereby requiring a minimum repetition frequency for the mute actions. This all significantly deteriorates the overall receiver performance.

SUMMARY OF THE INVENTION

Therefore, it is a first object of the invention to provide a receiver with an automatic gain control circuit which eliminates intermodulation interference more accurately than the receiver disclosed in the above referenced U.S. patent. A second object of the invention is to provide a receiver with an automatic gain control circuit without the necessity to interrupt the processing of the desired signal and switch the tuning. Other objects and advantages of the present invention will become apparent from the following summary and detailed description.

A receiver of one of the referenced types according to the invention is therefore characterized in that an output of the analog signal processing means is coupled through frequency selective means for channel selection and an amplitude detector to a first terminal of the interfering signals detection means. A signal generator for generating a gain modulation signal is coupled to a gain control input of said analog signal processing means as well as to a second terminal of the interfering signal detection means. The intermodulation interference detection means comprises a correlator included in a feed back loop of said automatic gain control circuit. It supplies a DC gain control signal input of the analog signal processing means for detection of differences in relative variations between the gain control signal on the one hand and the output signal of the amplitude detector of the other hand for reducing said differences by a DC gain setting adjustment of the analog signal processing means.

A variation of the gain of the analog signal processing means will cause the level of the useful signal to vary linearly with said gain variation, whereas intermodulation interference components and harmonic distortion products will vary to a second or higher order with said gain variation. According to the invention, this difference in gain variation is used to detect whether the output signal level of the analog signal processing means is predominated by the useful signal or by intermodulation and/or harmonic distortion interferences. The occurrence of a signal level at the output of the analog signal processing means varying disproportionally, i.e. to a second or higher order, with a gain variation of the analog signal processing means, is accurately detected in the correlator, and fed back as a gain control signal to the RF analog signal processing means. Due to this feedback, the accuracy in gain control is immune from element tolerances.

Furthermore, the detection of the intermodulation and/or harmonic distortion interferences is applied during correct tuning at a desired radio-signal, which, in contrast to the above mentioned known method of intermodulation interference detection, does not require to change tuning and mute the receiver. In the following the description given with respect to the detection and elimination of intermodulation interference also applies to harmonic distortion interferences.

A preferred embodiment of a receiver according to the invention is characterized in that the gain modulation signal comprises a bandwidth limited pseudo random carrier frequency. The use of such gain control signal prevents the gain variation from becoming noticeable in the useful signal. For the same purpose, the amplitude of the gain modulation signal is preferably chosen to be smaller than 2 dB.

Another preferred embodiment of a receiver according to the invention, in which the effect of the gain variation on the signal output level of the analog signal processing means is prevented from becoming noticeable in the useful signal, is characterized in that the signal generator is coupled through inverting means to a modulation signal input terminal of an amplitude modulator following said analog signal processing means. With this measure, said gain variations can be completely eliminated.

Preferably, a delay circuit is coupled between the signal generator and said modulation signal input terminal of the amplitude modulator to compensate for the signal delay occurring in the analog signal processing means.

For a cost effective realization, the analog signal processing means preferably comprises a controllable attenuator preceding a broadband amplifying stage coupled to the gain control input of the analog signal processing means providing a signal attenuation varying with said gain control signal. In a further preferred embodiment, the frequency selection means for channel selection comprises a mixing stage followed by an IF circuit for IF channel selection. An output of said IF circuit is coupled through said level detecting means to the first terminal of the correlator.

Another preferred embodiment of a receiver according to the invention is characterized in that an output of the signal generator is coupled to a first input of a signal combiner, an output of the correlator being coupled to a second input of the signal combiner and an output of said signal combiner being coupled through said gain control input of the analog signal processing means to said controllable attenuator.

The above and other objects, features and advantages of the present invention will become more apparent from the following description referring to the accompanying drawings, in which a preferred embodiment of the present invention is shown by way of illustrative example and in which identical reference indications are used for corresponding circuitry.

BRIEF DESCRIPTION OF THE DRAWINGS

FIGS. 4a, 4b and 4c are timing charts illustrative of the various signals occurring in the receiver of FIG. 3.

DETAILED DESCRIPTION OF THE PREFERRED EMBODIMENTS

Figure 1A:
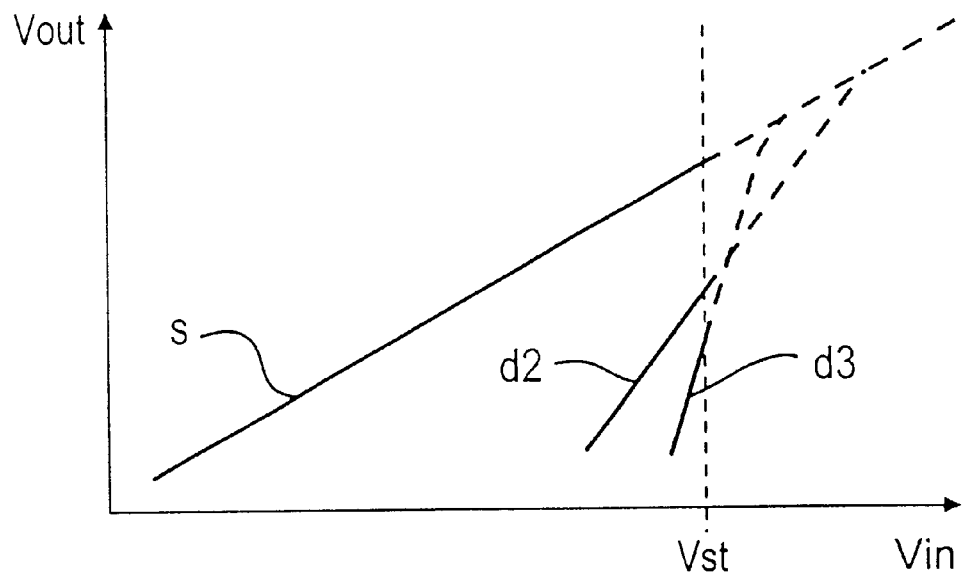
FIGS. 1a and 1b are diagrams which illustrate the phenomenon of intermodulation interference.
Figure 1B:
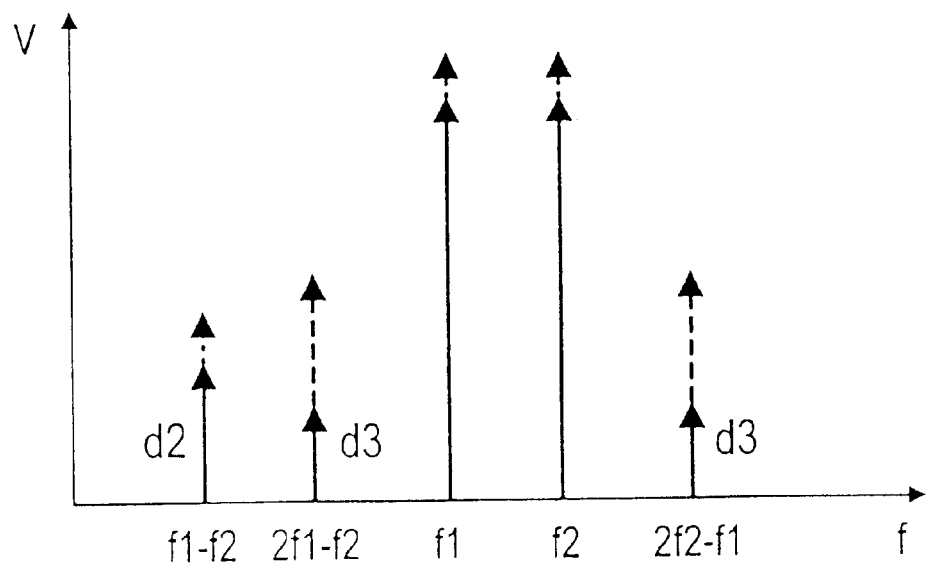

FIGS. 1a and 1b are diagrams illustrating the phenomenon of intermodulation interference, in which FIG. 1a shows that the differences in amplitude increase between a desired first order signal s and unwanted second and third order intermodulation products d2 and d3, respectively, as a function of the fieldstrength of the received RF frequency band. These higher order intermodulation products are caused by intermodulation interference between all RF carrier signals within the received RF frequency due to non-linearities in the signal processing within (the amplifiers, mixer and demodulator) of a receiver.

Where desired RF signals vary proportionally with variations in the reception fieldstrength, the higher order intermodulation products vary non linearly (i.e. to their order of harmonic distortion) with variations in the reception fieldstrength. As indicated in FIG. 1a, the RF input signal amplitude is stabilized at a value Vst at which the desired first order signal component s dominates over the intermodulation products d2 and d3 and is sufficiently large to be reproduced without being noticeably distorted by intermodulation interferences. The occurrence of unwanted higher order intermodulation products within the received RF signal band is in practice unavoidable.

Suppose RF carrier signals f1 and f2 simultaneously occur within the received RF frequency band as shown in FIG. 1b. Then intermodulation products occurring nearest to those carrier frequencies f1 and f2, are a second order intermodulation product d2 occurring at f1+/−f2, and two third order intermodulation products d3 occurring at respectively 2f1+/−f2 and 2f2+/−f1. Because there are many RF carrier frequencies, these intermodulation products will be spread over the full RF input frequency band. Once occurring within a wanted signal channel, the intermodulation products cannot be filtered out or suppressed without losing useful signal components.

The effect of such intermodulation products on the reproduced signal is reduced according to the invention by an automatic gain control setting the RF input signal amplitude to a value corresponding to the abovementioned value Vst. In the determination of this value Vst, the above difference in amplitude increase between the wanted RF signal and the unwanted higher order intermodulation products is used to distinguish between signals predominantly determined by wanted signals and signals predominantly determined by unwanted intermodulation products.

Figure 2:
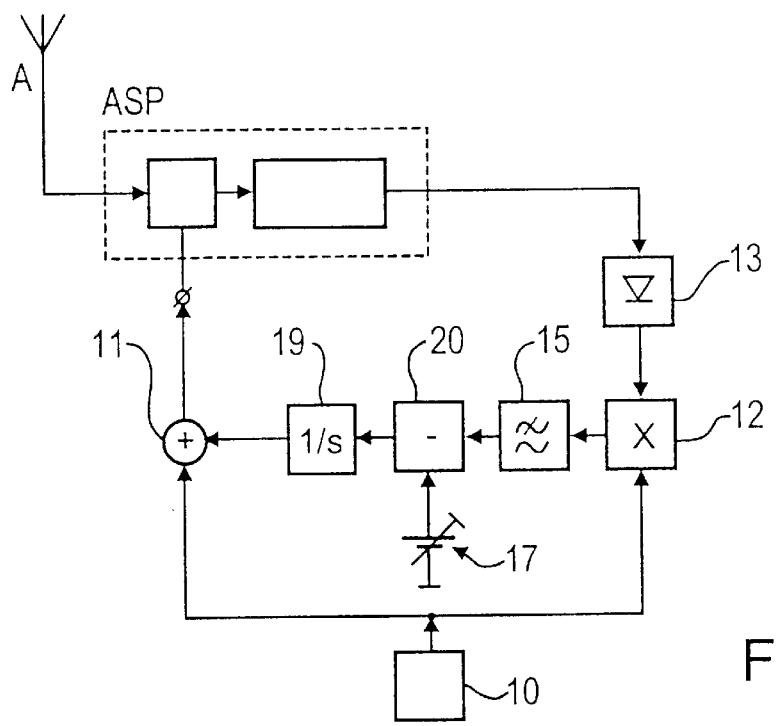
FIG. 2 is a block diagram illustrating an AGC circuit according to the invention.

FIG. 2 shows the basic concept of an AGC circuit according to the invention applied to analog signal processing means ASP, which at least comprises a controllable broadband RF amplifier, but which may comprise various other analog receiver circuitry as will be explained in more detail with reference to FIG. 3. The analog signal processing means ASP are gain controlled by means of a gain control signal combining various control signal components supplied to a gain control input of said analog signal processing means ASP. For the determination of a gain set point whereat intermodulation products occurring within the frequency range of a wanted signal are dominated by the wanted signal, i.e. at an RF input level value of Vst, the RF input signal of the analog signal processing means ASP is incrementally varied in amplitude with a gain modulation signal provided by a signal generator 10 through signal summing means 11 to a gain control input of said analog signal processing means ASP.

The amplitude variations of the output signal of the analog signal processing means ASP level within the channel bandwidth of the wanted signal resulting therefrom are being measured in an amplitude detector 13 functioning as level detection means, and are supplied to a first input of a correlator 12, which may be comprised of a signal multiplier. The signal generator 10 also supplies said gain modulation signal to a second input of the correlator 12.

The correlator 12 provides an output signal comprising an unwanted DC signal component indicative of the differences in amplitude variation of the signal supplied to its first and second inputs and therewith for the overall level of unwanted intermodulation and harmonic distortion products occurring within the bandwidth of the wanted signal. There is an expected DC signal component resulting when no intermodulation interference occurs in the analog signal processing means ASP. For example, this happens when the amplitude variation of the signal supplied to the first and second inputs of the correlator 12 are mutually corresponding.

In this situation, the correlator 12 functions as an intermodulation interference detection means. The correlator 12 is coupled to through a lowpass filter 15 to a differential stage 20 in which the expected DC signal component in the output signal of the correlator 12 is compensated by a preset DC voltage supplied by an adjustable preset DC voltage source 17. This results in a DC output signal of the differential stage 20 corresponding to the above unwanted intermodulation and harmonic distortion products occurring within the bandwidth of the wanted signal. This DC output signal is supplied via an integrator 19 to the signal summing means 11, in which it is added to the gain modulation signal of the signal generator 10 into a combined gain control signal, which is supplied to the gain control input of said analog signal processing means ASP. A feedback loop in therewith obtained including the correlator 12, in which the differences in relative amplitude variations between the gain modulation signal on the one hand and the output signal of the amplitude detector 13 on the other hand are automatically reduced.

This causes the ASG to stabilize the gain of the analog signal processing means ASP at a gain set point where intermodulation and harmonic distortion products occurring within the frequency range of a wanted signal are dominated by the wanted signal, i.e. at a RF input level value of Vst.

To make this automatic adjustment of the gain set point effective at various gain setting values within a certain control range, the preset DC voltage supplied by the adjustable preset DC voltage source 17 can be chosen to differ from the above expected DC signal component in the output signal of the correlator 12, resulting in an adjustable offset in the gain set point of the analog signal processing means ASP.

Figure 3:
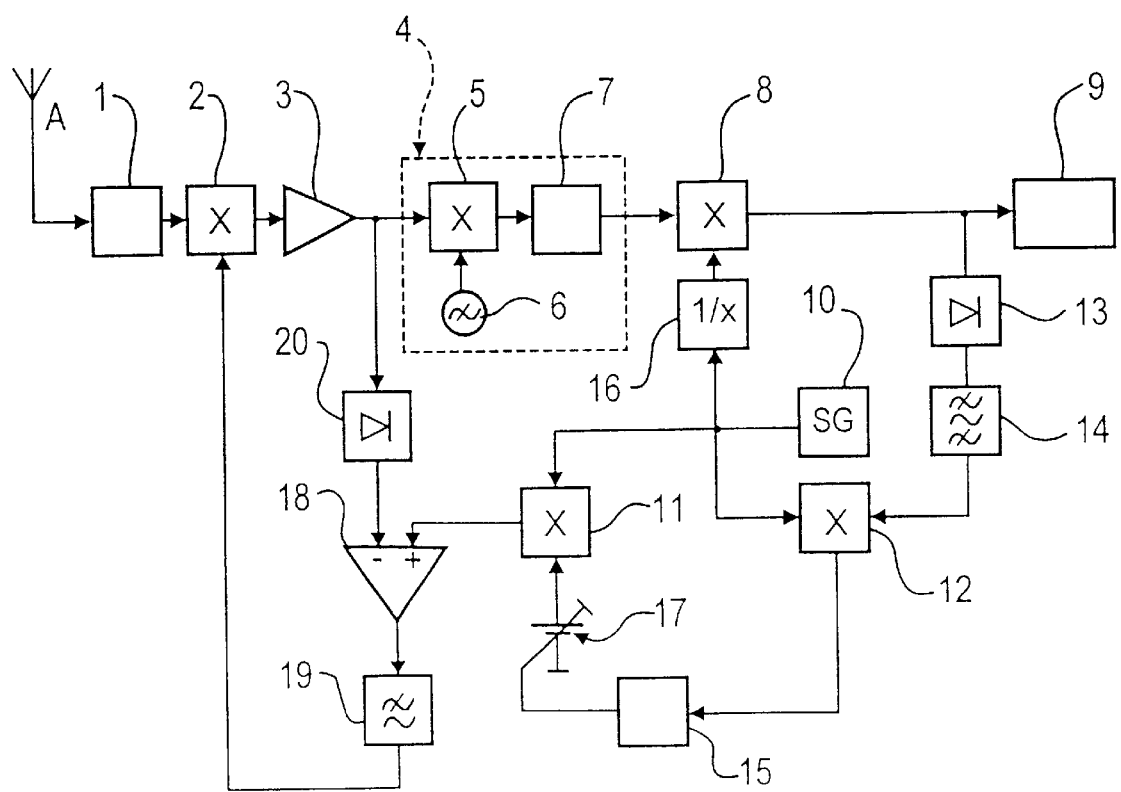
FIG. 3 is a block diagram of a receiver according to a preferred embodiment of the present invention.

FIG. 3 shows a receiver according to a preferred embodiment of the present invention comprising analog signal processing means 1–8, substantially corresponding to the above analog signal processing means ASP and which is connected to antenna means A, an includes an RF input stage 1; controllable RF amplifier means 2, 3 comprising a controllable attenuator 2 and an RF amplifier 3; frequency selective means 4 comprising a mixer 5 coupled to an IF filter 7, the mixer 5 being supplied with a local oscillator signal from a tunable local oscillator 6 and an amplitude modulator 8 followed by If and audio signal processing means 9. In the analog signal processing devices 1–8 the RF frequency band comprising a wanted RF signal modulated on an RF carrier frequency is supplied from the antenna means A to the RF input stage 1, comprising a passive, selective matching network, and is broadband amplified in the controllable RF amplifier means 2, 3. An RF to If conversion of the wanted RF signal is provided in the mixer 5 with a local oscillator signal deviating in frequency from the carrier frequency of the wanted RF signal over a frequency distance equal to the IF frequency. An IF channel selection of the so converted IF signal is provided in the IF filter 7. Further processing of the IF signal into an audio signal suitable to be reproduced in audible form is provided in the IF and audio signal processing means 9. The processing of a wanted RF signal into an audio signal is known and there is no need for further explanation for a proper understanding of the invention.

The output of the controllable RF amplifier means 2, 3 is fed back through a level detector 20, the inverting input of said differential stage 18 and an integrator 19 to its gain control input terminal, thereby providing an automatic gain control (AGC) stabilizing the output signal level of the controllable RF amplifier means 2, 3 to a certain set value.

As already mentioned above, the RF to IF conversion of the so established RF signal in the mixer 5 is followed by an IF channel selection of the wanted signal. The selected IF signal is applied through the amplitude modulator 8 to intermodulation interference detection means 11–14 comprising level detecting means 13, 14 having a level detector 13 followed by a bandpass filter 14, being coupled to a first terminal of a correlator 12. The intermodulation interference detection means 11–14 also comprises a signal generator 10 for generating a gain modulation signal and is coupled to a gain control input of the controllable attenuator 2 of said controllable RF amplifier means 2, 3 as well as to a second input terminal of the correlator 12.

The correlator 12 may comprise a signal multiplier supplying an output signal, which is indicative for the overall level of the intermodulation interference occurring in the circuitry 2–8 of the analog signal processing means 1–8 and which is coupled through an integrator 15 to a control input of the above mentioned adjustable DC voltage source 17. The so obtained DC gain control signal at the control input of the above mentioned adjustable DC voltage source 17 varies with the overall level of the intermodulation interference occurring in the circuitry 2–8 of the analog signal processing means 1–8. The DC gain control signal and the gain modulation signal from the signal generator 10 are respectively coupled to first and second inputs of a signal multiplier 11, providing in its output signal a signal product comprising the sum or superposition of said DC gain control signal and said gain modulation signal. This sum signal is supplied to the non-inverting input of the differential stage 18 and therewith injected in the abovementioned AGC loop of the controllable RF amplifier means 2, 3. This results in an automatic setting of the gain of the controllable RF amplifier means 2, 3 to a value at which the first order desired signal at the output of the amplitude modulator 8 is substantially greater than the higher order intermodulation products occurring within the channel bandwidth of this desired signal.

To prevent IF amplitude variations caused by the gain modulation signal from passing through to the IF and audio signal processor 9, the amplitude modulator 8 is modulated with the inverse gain modulation signal of the signal generator 10. The signal inversion needed therefor is provided in the inverting stage 16 coupled between an output of the signal generator 10 and a modulator input of the amplitude modulator 8.

A reduction of the effect of the gain modulation provided by the controllable attenuator 2 on the signal to be reproduced can alternatively be achieved by limiting the incremental gain modulation signal amplitude variations and/or to modulate the gain modulation signal with a bandwidth limited, pseudo random frequency.

The AGC according to the invention can be further improved e.g. by using delay circuits (not shown) to compensate for differences in signal transition time between the various signal paths, such as occurring in the signal path from the signal generator 10 passing through circuits 11, 18, 19, 2–8, 13 and 14 to the first input of the correlator 12 on the one hand and in the direct signal path from the signal generator 10 to the second input of this correlator.

Furthermore, many changes and modifications may be made in the above embodiments without departing from the scope of the appended claims. For instance, the controllable attenuator 2 may be replaced by a controllable amplifier, the RF to IF conversion may be replaced by a direct conversion, etc.

FIG. 4a illustrates an example of the IF signal supplied by the IF filter 7 of the frequency selective means 4 to the amplitude modulator 8. This IF signal varies incrementally in amplitude due to the gain modulation signal supplied to the gain control input of the analog signal processing means ASP, respectively 1–8. In this example, an increase in the level of higher order intermodulation and harmonic distortion products occurs after a point in time t0 reflected in a likewise increase of the incremental amplitude variations.

FIG. 4b illustrates the effect of the amplitude modulation of the signal of FIG. 4a in the amplitude modulator 8 with the inverse gain modulation signal of the signal generator 10 provided by the inverting stage 16. The non-zero amplitude variations mark the time interval t1–t0, in which the AGC according to the invention is active.

FIG. 4c illustrates the variation of the gain control signal supplied to the gain control input of the analog signal processing means ASP in the receiver concept of FIG. 2 and to the gain control input of the controllable attenuator 2 of the analog signal processing means 1–8 as a result of the variation in the level of higher order intermodulation products as shown in FIG. 4a.

The increase in the level of higher order intermodulation products causes the DC level of said gain control signal to reduce after a certain control time constant, i.e. after t1. As a result thereof the overall gain of the analog signal processing means ASP, respectively 1–8, is reduced causing the level of higher order intermodulation products to decrease during a time interval starting at t1 and closing at t2. After t2 the overall gain of the analog signal processing means ASP, respectively 1–8 is established to a new gain set point, where the level of higher order intermodulation products d2, d3, etc. is decreased below the level of the wanted first order signals.

What is claimed is:

1. A receiver comprising:

an analog signal processing means;

an intermodulation interference detector; and an automatic gain control circuit for controlling a gain of the analog signal processing means, wherein an output of the analog signal processing means is coupled through a frequency selective means and an amplitude detector to a first terminal of the intermodulation interference detector and a signal generator for generating a gain modulation signal that is coupled to a gain control input of said analog signal processing means as well as to a second terminal of the intermodulation interference detector, the intermodulation interference detector comprising a correlator included in a feed back loop of said automatic gain control circuit and which supplies a DC gain control signal to the gain control input of the analog signal processing means to detect differences in relative variations between the gain control signal on the one hand and the output signal of the amplitude detector on the other hand for reducing said differences by a DC gain setting adjustment of the analog signal processing means.

2. The receiver of claim 1, wherein a signal multiplier in the automatic gain control circuit has first and second terminals respectively coupled to outputs of the signal generator and the correlator, an output of the signal multiplier being coupled to gain control input of said analog signal processing means.

3. The receiver of claim 2, wherein the output of said analog signal processing means is coupled to an input of a level detecting means, an output of said level detecting means coupled to a first terminal of a signal combiner, the signal multiplier being coupled to a second terminal of the signal combiner circuit, the signal multiplier supplying the difference between the output signals of the signal multiplier and the level detecting means to the gain control input of said analog signal processing means to provide negative feedback of the further level detecting means to the gain control input of the analog signal processing means.

4. The receiver according to claim 1, wherein an amplitude modulator follows the frequency selective means, the signal generator being coupled through an inverter circuit to said amplitude modulator, an output of the amplitude modulator being coupled through the amplitude detector to said first terminal of the intermodulation interference detection means.

5. A receiver according to claim 1, wherein the analog signal processing means comprises a controllable attenuator preceding an amplifying stage that is coupled to the gain control input of the analog signal processing means.

6. The receiver of claim 1, wherein the frequency selective means for channel selection comprises a mixing stage followed by an IF circuit for IF channel selection, an output of said IF circuit coupled through said amplitude detector to the first terminal of the correlator.

* * * * *